United States Patent [19]

Ackley

[11] Patent Number: 4,534,314
[45] Date of Patent: Aug. 13, 1985

[54] LOAD LOCK PUMPING MECHANISM

[75] Inventor: James W. Ackley, Los Altos, Calif.

[73] Assignee: Varian Associates, Inc., Palo Alto, Calif.

[21] Appl. No.: 609,052

[22] Filed: May 10, 1984

[51] Int. Cl.³ ............................................. C23C 13/08
[52] U.S. Cl. .................................... 118/733; 118/719;
 118/500; 118/729; 204/298; 414/217
[58] Field of Search ................. 118/733, 719, 729, 50,
 118/730, 500; 414/217, 219, 220, 221; 204/298

[56] References Cited

U.S. PATENT DOCUMENTS

| 3,649,339 | 3/1972 | Smith | 118/733 X |
| 3,856,654 | 12/1974 | George | 204/298 |
| 3,931,789 | 1/1976 | Kakei et al. | 414/219 X |
| 3,981,791 | 9/1976 | Rosvold | 204/298 |
| 4,201,152 | 5/1980 | Luscher | 118/729 X |
| 4,226,208 | 10/1980 | Nishida et al. | 118/730 X |
| 4,306,731 | 12/1981 | Shaw | 269/903 X |
| 4,311,427 | 1/1982 | Coad et al. | 414/217 |

FOREIGN PATENT DOCUMENTS

| 1466790 | 3/1977 | United Kingdom . |
| 2066300 | 7/1981 | United Kingdom | 204/298 |

Primary Examiner—Norman Morgenstern
Assistant Examiner—Bernard F. Plantz
Attorney, Agent, or Firm—Stanley Z. Cole; Kenneth L. Warsh

[57] ABSTRACT

In a vacuum system for processing workpieces, a vacuum chamber has a workpiece-entrance opening. Load lock means for said entrance opening include a door for sealing the outside of said opening, a movable closure member within the chamber to seal the entrance opening from the interior of the vacuum chamber, and forming a load lock chamber when the door and closure member are both in closed positions. The load lock chamber is connected to a roughing pump and is separately connected to a high vacuum pump through a pumping opening in one or the other of said internal closure member or said door. A large aperture valve is provided in said pumping opening. In one embodiment said pumping opening is connected via suitable conduits and valves to a roughing pump and also to a high vacuum pump. In another embodiment said pumping opening is connected only to the high vacuum pump, and the roughing pump is connected to the load lock chamber via an aperture in the edge of the entrance opening in the processing chamber wall.

14 Claims, 12 Drawing Figures

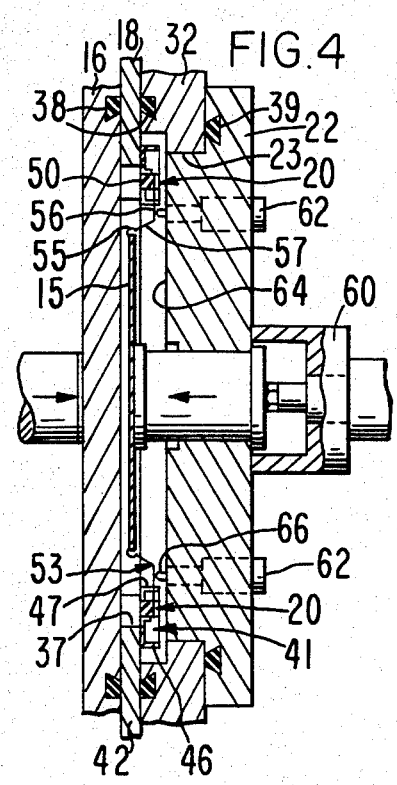
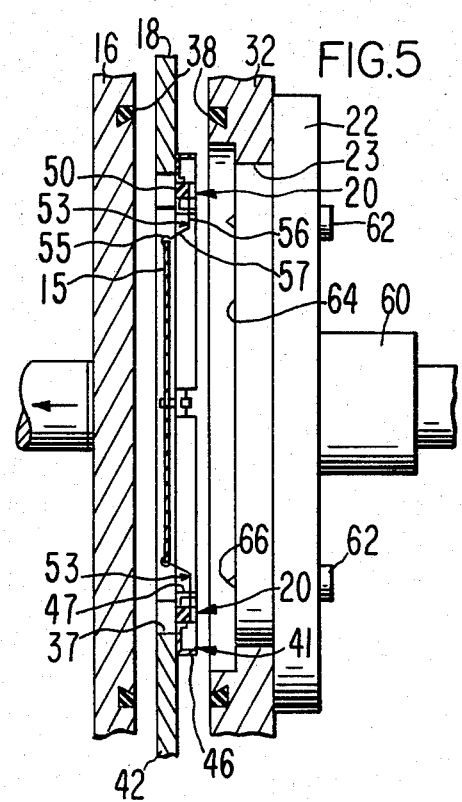
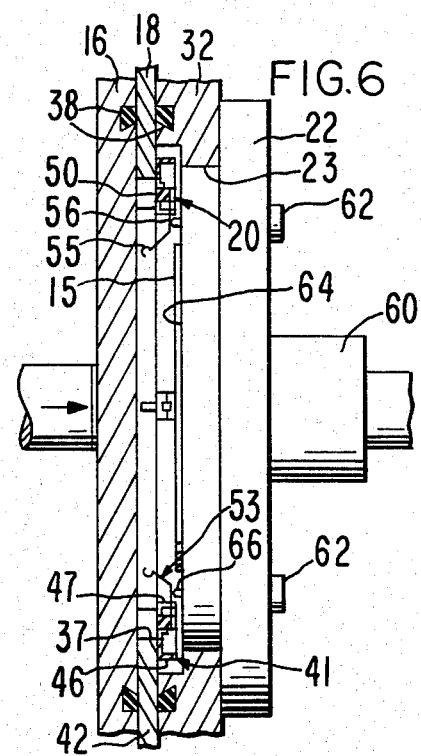

LOAD LOCK PUMPING MECHANISM

BACKGROUND OF THE INVENTION

The present invention relates to processing substrates in a vacuum chamber. More particularly, the field of the invention is sputter coating of semiconductor wafers, and apparatus for effecting such metallization coating of wafers individually, and on a serial, continuous basis. The invention is an improvement in the arrangement for pumping the load lock of the vacuum chamber, which increases the rate of processing and decreases the costs.

In such continuous throughput systems, wafers must be introduced into the vacuum chamber through a load lock in order to prevent exposing the vacuum condition in the chamber to the air outside the chamber.

When a wafer is to be loaded into the chamber, the inner closure means, such as a sealing plate, is activated to seal the inner side of the opening, and then the outer closure means, such as a sealing door, is opened. Next the door is opened, a wafer is inserted through the opening, and the door is again closed. The load lock chamber now containing the wafer is pumped down to contain an atmosphere compatible with the atmosphere in the processing vacuum chamber, and then the inner sealing plate is moved away from the opening to expose the wafer for processing in the main vacuum chamber.

OBJECT OF THE INVENTION

The object of the invention is to provide an improved load lock arrangement for use in vacuum processing systems wherein workpieces are introduced into the system without exposing the processing chamber to air.

SUMMARY OF THE INVENTION

Preferred embodiments of the invention are described by way of example in connection with apparatus for coating wafers individually, which apparatus includes a ring-shaped sputtering source emitting coating material, means for locating an individual one of the wafers in facing stationary relationship to the source, as well as means for maintaining the source and wafer in an argon environment of up to 20 microns pressure (1 micron=$10^{-3}$ millimeters of mercury=1 millitorr=0.133 Pa) during coating of the wafer.

The coating apparatus includes internal wafer support means positioned within the chamber immediately inside of the entrance thereof, including means for releasably and resiliently gripping edgewise an individual wafer, to immediately accept a wafer upon insertion and permit instant release and removal upon completion of coating. The apparatus also includes load lock means including a movable closure member within the chamber to seal the wafer support means off from the remainder of the chamber interior and when the door of the entrance is opened, isolating the wafer and support means from the chamber environment during insertion and removal of a wafer. The load lock is connected to a roughing pump and is separately connected to a high vacuum pump through a pumping opening in one or the other of said internal closure member or said door. A large aperture valve is provided in said pumping opening. In one embodiment said pumping opening is connected via suitable conduits and valves to a roughing pump and also to a high vacuum pump. In another embodiment said pumping opening is connected only to the high vacuum pump, and the roughing pump is connected to the load lock chamber via an aperture in the edge of the entrance opening in the processing chamber wall.

These and further constructional and operational characteristics of the invention will be more evident from the detailed description given hereinafter with reference to the figures of the accompanying drawings which illustrate preferred embodiments and alternatives by way of non-limiting examples.

BRIEF DESCRIPTION OF THE DRAWINGS

FIG. 4 is a cross-sectional elevational view of the door and load lock of FIGS. 1 through 3, showing the manner in which the door assembly loads a wafer into the load lock, and the manner in which the load lock is sealed from the remainder of the processing chamber interior;

FIG. 5 is a view similar to FIG. 4, showing the relative positions of the elements of the load lock upon completion of loading of the wafer therewithin;

FIG. 6 is a view similar to FIGS. 4 and 5, showing the position of the wafer and the load lock elements just subsequent to the extraction of a wafer from the internal wafer support assembly, and prior to the opening of the door, or just before the loading of a wafer into the internal wafer support assembly immediately after closure of the door for loading;

DETAILED DESCRIPTION

Figure 1:
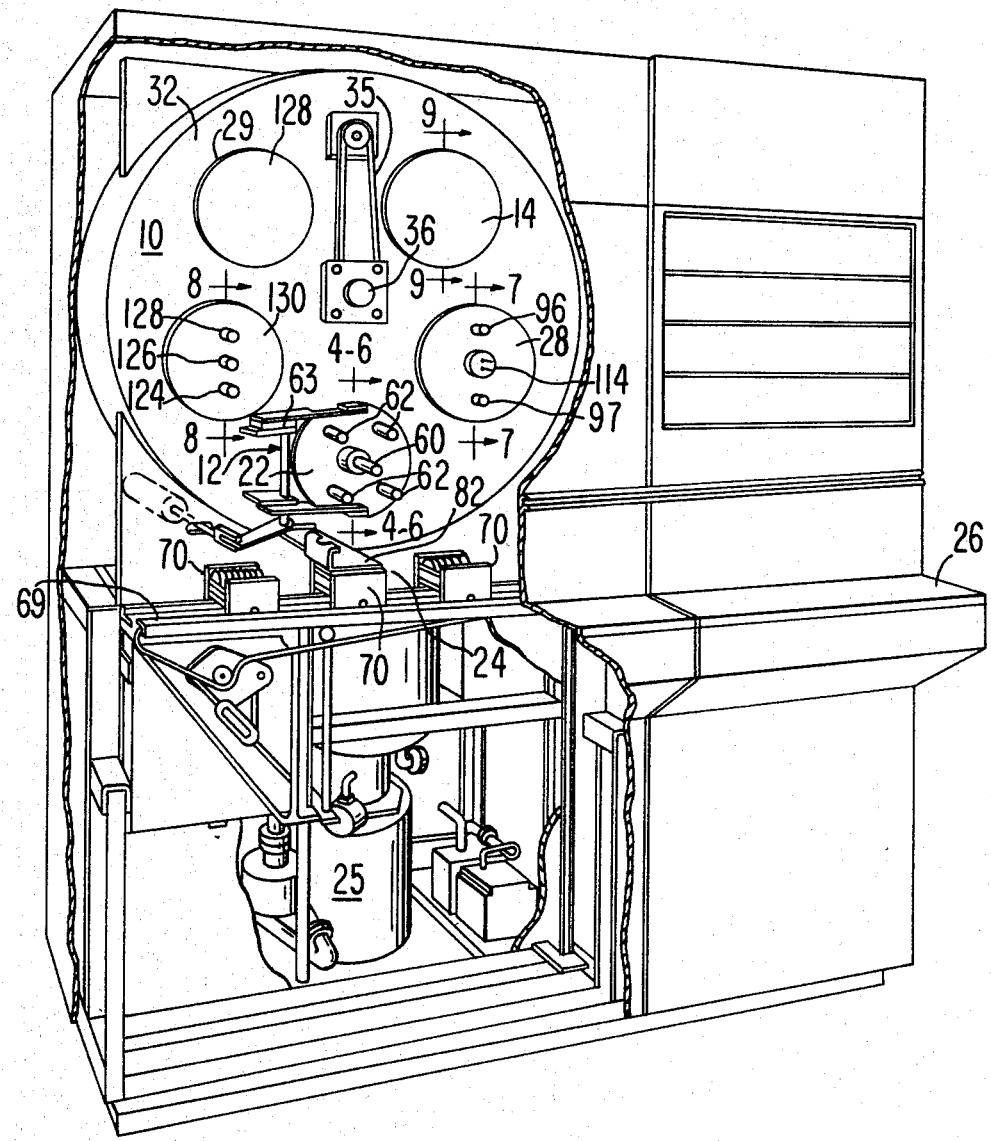
FIG. 1 is an elevational view of a complete wafer coating system in which the invention is particularly useful, showing the main cylindrical processing chamber, the door arrangement at the entrance of the load lock to the chamber, and the four remaining work stations of the processing chamber, together with portions of the wafer cassette load/unload assembly.

The wafer coating system of FIG. 1 principally includes a generally cylindrical vacuum processing chamber 10 having five work stations, one of which comprises load lock arrangement 12, and one of which comprises coating station 14. Remaining further elements of the coating system found within chamber 10 may be seen in more detail in FIG. 2, which also shows a wafer 15 within load lock 12, and also a wafer at coating station 14. Further elements include pressure plate 16, wafer carrier plate assembly 18, and clip assemblies 20 (better shown in FIG. 3), by which a wafer is retained within wafer carrier plate assembly 18. Door assembly 22, which seals the entrance opening 23 of chamber 10, and which cooperates with the just mentioned elements to form the chamber load lock arrangement 12, completes the principal elements of processing chamber 10. These elements, together with cassette load/unload assembly 24 and the various ancillary vacuum pumps 25 for chamber and load lock evacuation, and control means, are all housed compactly in cabinet 26.

The system desirably includes several other work stations other than load lock arrangement 12 and coating station 14, in particular wafer heating station 28, auxiliary station 29, and wafer cooling station 130. All five work stations are equally spaced laterally from each other and from the central axis 36 of the vacuum chamber. Also included are at least two pneumatic rams 30 and 31 which function to drive pressure plate 16 and wafer carrier plate assembly 18 against the front wall 32 of chamber 10, and carrier plate drive 35, which centrally mounts carrier plate assembly 18, which is circular and of nearly the diameter of front wall 32, for rotation about the central axis 36 of the vacuum processing chamber.

In general, wafers are individually presented and loaded by door assembly 22 into load lock arrangement 12 and thereby within wafer carrier plate 18. The wafer is then passed in turn to each of the work stations, where it is heated for completion of outgassing and/or sputter-etch cleaned, coated, optionally coated with a second layer, cooled, and the returned again to load lock 12 for removal from wafer carrier plate assembly 18, again by door assembly 22. Although the foregoing generally-described system is a rotary one and a multistation one, the load lock and coating steps are equally applicable to a single station or dual station configuration, or a non-rotary or in-line arrangement as well.

Now considering the system in more detail from the view point of an incoming wafer, the load lock arrangement 12 through which a wafer 15 must be passed in order to enter the evacuated environment of the chamber is of key importance. FIGS. 4–6 are especially important in appreciating the operation of the movable elements of load lock 12. As pointed out above, the load lock is defined by a sandwich arrangement of the elements between the chamber door assembly in its closed position against the front wall of the processing chamber and the pressure plate in its driven position. The load lock is built around a circular aperture 37 within wafer carrier plate assembly 18, which is positioned internally of the chamber just inside the chamber entrance 23 associated with load lock 12, with plate assembly 18 generally parallel to wall 32 and the pressure plate 16, positioned within the chamber rearwardly of plate assembly 18. Wafer 15 is loaded and held within the load lock and within the plate assembly by means which will be described below. The controlled subatmospheric environment which may be provided within chamber 10 for certain wafer processing operations may be, for example, up to 20 microns or argon or other inert gas for sputter coating operations. Because of this evacuated environment, the load lock region must be sealed off from the remainder of the chamber interior whenever door 22 is open in order to preserve the evacuated invironment. Pressure plate 16 serves the function of isolating the load lock area from the chamber interior (and also several other functions simultaneously at other work stations, as will be shown below). Pneumatic rams 30 and 31, mounted to the rear plate of the processing chamber, drive the pressure plate and plate assembly against front chamber wall 32, with pneumatic ram 30 being applied particularly to the pressure plate concentrically with load lock arrangement 12 to effect the sealing of the load lock. Both pressure plate 16 and chamber front wall 32 are equipped with O-rings 38 arranged in a circular pattern concentric with chamber entrance 23 provide vacuum seals in the sandwich arrangement of elements defining the load lock. Chamber door assembly 22, which in its closed position seals against the outside surface of chamber front wall 32 and also includes a concentric O-ring 39 to provide the vacuum seal, completes the load lock by sealing off the chamber entrance 23 from the outside atmosphere. FIGS. 4 and 6 show the completed load lock, with pressure plate 16 in its forward, advanced position, compressing plate assembly 18 against chamber wall 32, and sealing off aperture 37; and door 22 closed to seal off chamber entrance 23 to form the load lock about aperture 37, which is only of a size no larger than necessary to accommodate a single wafer. It may be seen that an unusually thin low-volume load lock is thereby defined with a minimum of elements, and of a minimum size necessary to accommodate wafer 15 therewithin. FIG. 5 shows pressure plate 16 in its withdrawn, rest position, and with the wafer already secured within plate assembly 18 within the chamber.

Figure 2:
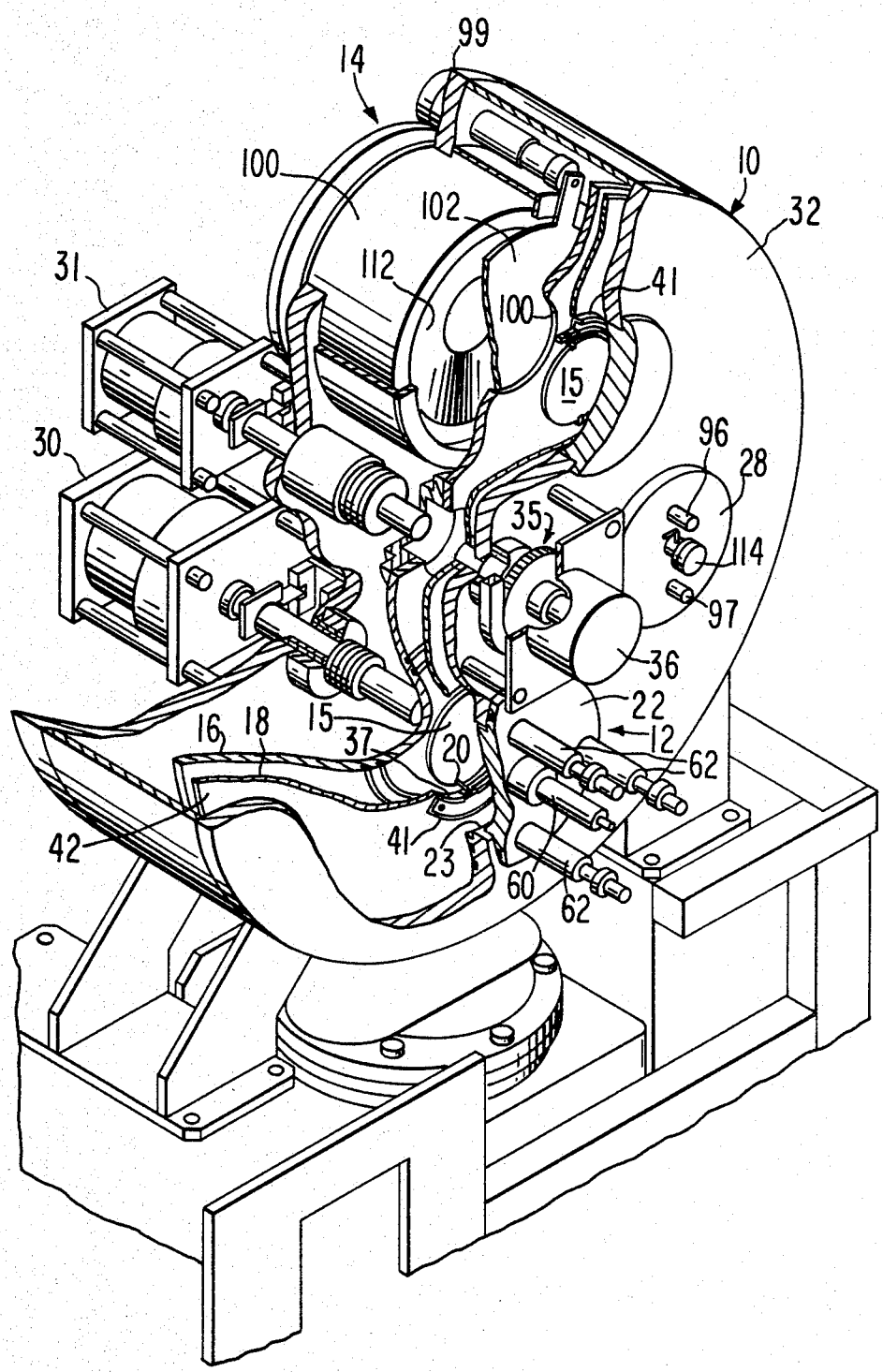
FIG. 2 is a broken-away perspective view of the processing chamber of FIG. 1, showing the load lock and sputter coating stations in more detail.

Cooperating with this thin load lock arrangement is wafer carrier plate assembly 18, which includes a plurality of circular apertures such as at 37 (as best seen in FIG. 2) matching the number and spacing of work stations within chamber 10. The apertures 37 are of a diameter larger than the wafers, are equally spaced from each other, and centered at the same radial distance from the central axis of the processing chamber. The aforementioned work stations are likewise spaced, so that when any aperture of the wafer carrier plate assembly 18 is aligned with any work station of the processing chamber, the remaining apertures are each similarly aligned with a respective one of the remaining work stations. Thus, if a wafer is secured within each of the apertures of carrier plate 18, each of such wafers can individually processed at a work station simultaneously with the processing of other wafers respectively at the remaining work stations. In this manner, a wafer is individually processed at a given station, yet during the same time, several other wafers may also undergo other operations at the remaining work stations. In particular, while a wafer is being unloaded and/or loaded at load lock 12, another wafer may be coated at coating station 14, while still another wafer may be heated at heating station 28. Carrier plate drive 35 intermittently operates to move plate assembly 18 by the distance of one station so as to serially present each of the wafers in turn to each of the processing stations in a counterclockwise direction, until a given wafer finally returns to the load lock for unloading therefrom.

As the wafer is transported from work station to work station as above described, it is important that the wafer be supported within carrier plate assembly 18 so as to avoid any risk of mechanical damage and abrasion due to being moved about, and generally so as to be protected from mechanical shock, vibration, and abrasion. To this end, wafer carrier aperture 37 is of a diameter such that both a wafer and a set of clip assemblies 20 can be accommodated within the periphery of the aperture, and recessed and parallel with the carrier plate, thereby protecting the wafer. The set of thin edgewise-acting clip assemblies also is important to the formation of the thin load lock arrangement 12, and edgewise resiliently supports the wafer in an upright position within plate assembly 18. An aspecially advantageous form of such an edgewise acting clip assembly is shown in cross section in FIGS. 4 through 6. A set of four clip assemblies 20 is mounted within retaining rings 41 which are removably attached to the disc-like circular wafer carrier plate 42 concentrically with each of plate apertures 37, thus forming the complete wafer carrier plate assembly 18. This arrangement mounts a set of clip assemblies 20 in spaced relationship within the periphery of each circular aperture 37. Retaining rings 41 are of U-shaped cross section, with each having flanges 46 and 47 defining the inner and outer peripheries thereof, and clip assemblies 20 are recessed within these flanges.

As may be seen in any of the FIGS. 3 through 6, clip assemblies 20 each include a block 50 of generally rectangular cross section, which may be of insulating material for applications such as sputter etch for which electrical isolation of the wafer is desired, and an elongated spring clip 53 firmly engaged in wraparound fashion about block 50. Each clip 53 includes at the end thereof opposite the block an arcuate finger portion or tip 55, which is of a curvature in radius appropriate to gripping an edge of a wafer. Extending from block 50 is proximal flat portion 56, which lies within a plane closely adjacent and parallel with the plane defined by plate aperture 37. On the other hand, distal portion 57 is angled away from portion 56 down toward the plane of plate aperture 37, and defines an obtuse angle with portion 56. This clip arrangement results in a plurality of arcuate tips 55 lying on a circular pattern of diameter somewhat less than that of a typical wafer 15 (such circular pattern also lies within the plane of wafer carrier plate 42).

Wafer insertion into load lock 12 may be effected manually by simply pushing a wafer by its edge or rear face into clip assemblies 20. This will, however, involve some edge rubbing of the wafer against distal portion 56, to spread apart the clips somewhat to accept the wafer within tips 55. In order to insert a wafer without such rubbing contact therewith, the clips must first by slightly spread, and the allowed to rebound against the edge of the wafer upon insertion thereof into the load lock. Although both wafer insertion and clip spreading may be done manually, it is far preferable to avoid all such manual operations, and the consequent added risk of damage, error, and contamination associated therewith. Chamber door assembly 22 carries thereon a vacuum chuck 60 centrally axially therethrough, and a plurality of clip actuating means 62 near the periphery thereof. These elements, along with wafer cassette load-/unload assembly 24, provide an automated wafer loading and unloading arrangement for load lock 12 which avoids all such manual handling of the wafers, and automates the loading process.

Figure 3:
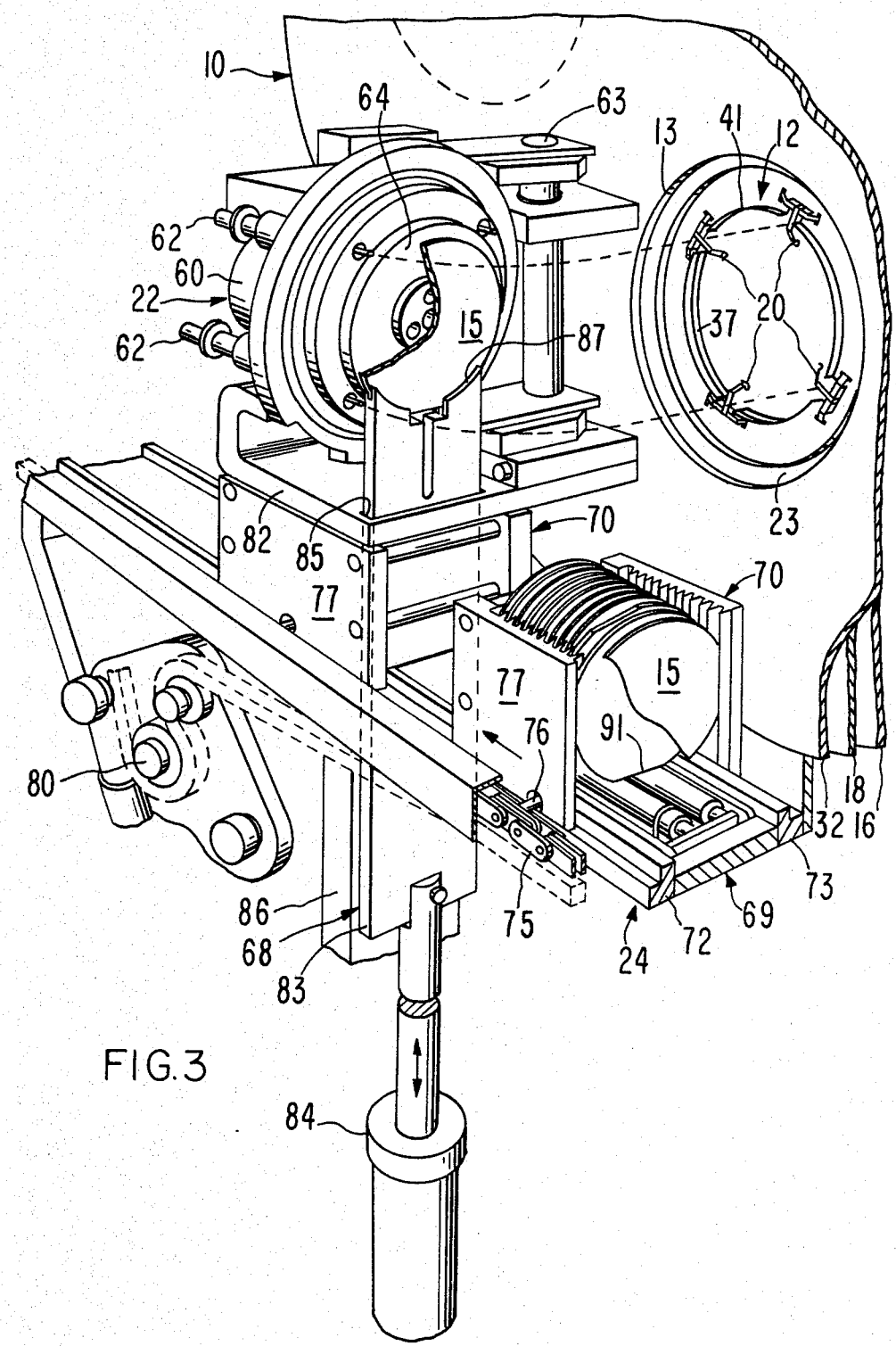
FIG. 3 is a perspective view of the cassette load/unload assembly of FIG. 1, showing its manner of cooperation with cassettes of vertically-oriented wafers and the door assembly of the processing chamber, and the manner in which wafers are transferred therebetween and into the chamber load lock.
Figure 7:
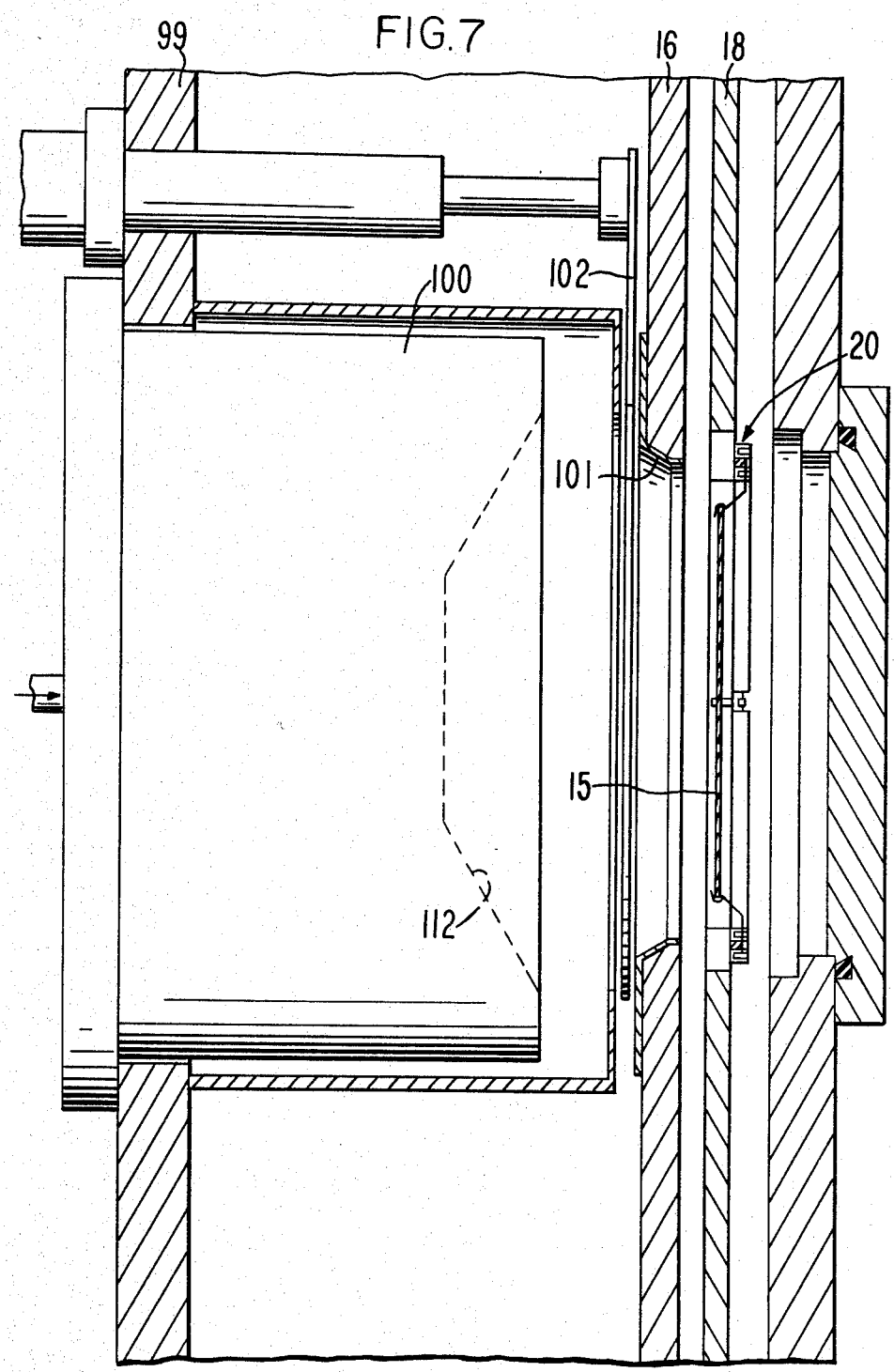
FIG. 7 is a sectional view of the coating station on an enlarged scale.

As thus seen in FIGS. 1 and 3, chamber door assembly 22 is attached to front wall 32 of chamber 10 by a heavy-duty hinge 63 having a vertical axis, to allow the door to open and close in a conventional manner to a fully open position as shown, wherein the door and its inside face 64 are vertical and perpendicular to the plane of chamber entrance 23, as well as to plate assembly 18. Vacuum chuck 60, which extends axially and centrally through the door so that the active end thereof forms part of the inside face 64 of the door, engages a wafer presented vertically to the inside face of the door and holds the wafer by vacuum suction as the door is closed, whereupon the vacuum chuck axially extends from the inner door face as shown in FIG. 4 to carry the wafer into engagement with clip assemblies 20. The vacuum chuck will then withdraw, and wafer 15 is held in the chamber by the clip assemblies and undergoes processing, and movement to the various work stations in turn by rotation of plate assembly 18. In this preferred embodiment, the vertical presentation of the wafer to the inside face 64 of the door is effected by load/unload assembly 24, as will be further detailed below.

It should be noted that the load lock arrangement, wafer carrier plate assembly 18, and door assembly 22 need not be limited to a vertical orientation, although this is preferred to help obviate any possibility of debris settling upon a surface of the wafer. The clip assembly, carrier plate and load lock arrangement of the invention, as well as all of the work stations, function equally well if oriented horizontally. Indeed, although the load-/unload assembly 24 for the vertically-oriented wafer cassettes is meant for vertical operation, the door assembly 22 could easily be made to load wafers into the load lock in a horizontal plane, yet accept wafers in a vertical orientation, by suitable modification of its manner of mounting to the chamber wall in a conventional manner.

As noted above, it is preferable to avoid simply loading a wafer into the clip assemblies 20 within the load lock by pushing a wafer against the angled distal portion 57 of the clips. In order to insert a wafer without such rubbing contact, the clips must first be slightly spread, and then allowed to rebound against the edge of the wafer upon insertion thereof into the load lock. This is accomplished automatically as the wafer is being inserted by vacuum chuck 60 by four clip actuating means 62 mounted within the door as aforementioned. Each clip actuating means 62 is mounted so as to be in registration with a corresponding one of clip assemblies 20 when the door is in its closed position. Each clip actuating means 62, shown in detail in FIG. 4, includes a pneumatic cylinder 65, a contact pin 66 which moves axially inwardly and outwardly, and is propelled by cylinders 65. Pins 66 are each in registration with one of flat proximal clip portions 56 when the door is in its closed position. With door 22 closed, pins 66 are extended just prior to insertion of a wafer, or as a wafer is to be withdrawn. The pressure of a pin 66 against the facing flat clip proximal portion 56 presses the clip and causes the tip 55 to swing back and outwardly, thereby releasing the clips, to facilitate insertion or removal of a wafer without rubbing contact therewith.

During wafer unloading after completion of the wafer processing, these operations are reversed, with the chuck again extending and applying vacuum to the backside of the wafer to engage same, with the clip actuating means again cooperating to release the chips, whereupon the door opens and the chuck retains the wafer on the inside face of the door by vacuum suction until the wafer is off-loaded by load/unload assembly 24.

As we have seen, when in its fully opened position, door assembly 22 is poised to accept a wafer for insertion into the load lock arrangement 12, or it has just opened and carried a finished wafer from load lock 12, which must then be unloaded from the vacuum chuck. The function of presenting a wafer to the door assembly 22 for loading, or for removing a processed wafer therefrom for unloading, is performed by cassette load/unload assembly 24, which includes wafer elevator assembly 68 and wafer cassette conveyor assembly 69. Extending below and on either side of chamber entrance 23 and attached to wall 32 of the chamber is the conveyor assembly, which moves cassettes 70 of wafers generally along from the right of the entrance as shown in FIG. 1 to left. The cooperating wafer elevator assembly 68 lifts wafers individually from the cassettes conveyed by conveyor assembly 69 to the operative end of vacuum chuck 60 within the inside face 64 of door assembly 22, or lowers such wafers from the door upon completion of processing.

Conveyor assembly 69 includes a spaced pair of parallel rails 72 and 73 extending horizontally and longitudinally across the front of wafer processing chamber 10. The rails support and convey cassettes 70, and the spacing of rails 72 and 73 is such that the sidewalls of the cassettes straddle the rail and enable the cassettes to be slidably moved along the rails across the conveyor assembly. Motive power for the movement of the cassettes is provided by chain drive means 75 which includes various guides and gear arrangements causing a roller chain to be moved alongside rail 72. The chain is provided at regular intervals with guide pins 76, which engage a matching cutout on the bottom of cassette wall 77 adjacent rail 72. Thus, the cassette is caused to move at the same rate as the chain toward and away from elevator assembly 68, as required. A stepper motor means 80 is provided as the driving power for the chain means 75, to provide precise control over the movement of the cassettes, so that any chosen individual wafer within a cassette may be positioned for interaction with the wafer elevator assembly 68.

The cassettes 70 hold a plurality of the wafers 15 in spaced, facing, aligned and parallel relationship, and are open at the top as well as over a substantial portion of their bottom, to permit access from below and above the wafers. They must be loaded so that the front faces of the wafers, which contain the grooves, steps, and other features defining the microcircuit components, face away from the inside face 64 of the open door 22, and so that the rear faces of the wafers face toward the door assembly. This ensures that when the vacuum chuck 60 engages the wafer, no contact is made with the front face containing the delicate microcircuits, and that the wafer is properly positioned upon insertion into the load lock 12 so that it will be oriented properly with respect to processing equipment within the processing chamber 10.

The wafer elevator assembly 68 is positioned below and just to the left side of chamber entrance 23 and includes an upper guide plate 82, a blade-like elevator member 83, and an actuating cylinder 84 connecting to the lower end of member 83. Elevator blade member 83 is guided for movement up and down in a vertical path intersecting at right angles conveyor 69 between rails 72 and 73 to inside face 64 of door 22. Guide slot 85 in guide plate 82 just below the inside face of the door in the open position provides the uppermost guide for blade 83, while a vertical guide member 86 extending below the conveyor toward the actuating cylinder also aids in retaining blade 83 on its vertical path. The width of blade 83 is less than that of the spacing between rails 72 and 73, and also less than the spacing between the main walls of the cassettes 70 which straddle rails 72 and 73. Blade 83 is also thinner than the spacing between adjacent wafers retained in cassettes 70.

Blade member 83 is further provided with an arcuate upper end 87 shaped to match the curvature of the wafers, and a groove within this end adapted to match the thickness of a wafer and retain a wafer edgewise therewithin. Thus, elevator blade member 83 passes between guide rails 72 and 73 and intersects conveyor and cassette at right angles thereto, upon stepper motor means 80 and chain drive 75 bringing a cassette and wafer into registration over the path of the blade. As may be seen, the cassettes are constructed to allow access from below to the wafers, and to allow elevator blade 83 to pass completely therethrough. Accordingly, upon stepper motor means 80 and chain means 75 placing a cassette and wafer in registration over the path of the blade, blade 83 moves upwardly between the conveyor rails to engage from below a wafer within the groove of its upper end 87, and elevate the wafer upwardly to a position in registration concentrically with and immediately adjacent inside face 64 of chamber door 22 in its open position. Note that since the wafers are vertically oriented, gravity aids in holding the wafers firmly yet gently and securely in the grooved end 87 of the blade.

Upon arrival of the wafer at the door 22, vacuum chuck 60 engages wafer 15 at its rear face by suction, and elevator blade 83 then is lowered through guide slot 85 and the cassette to a point below conveyor 69. Door 22 then closes with the wafer retained by the chuck 60, and the wafer is thereby loaded into the load lock arrangement 12 and chamber entrance 23 sealed simultaneously as described above for processing within chamber 10. Prior to completion of processing for wafer 15, still further wafers may be loaded within the remaining ones of apertures 37 of plate assembly 18; therefore the stepper motor and chain drive step the cassette one wafer position to move the next wafer serially in position over blade 83. Blade 83 then rises to repeat its operation of moving this next wafer upwardly to the open door, whose vacuum chuck then again engages that wafer for insertion into the load lock. Meanwhile, upon completion of processing for original wafer 15 by rotation in turn to each station, it is again at load lock 12, and vacuum chuck 60 again extends to the backside of the wafer while the door is still in its closed position, and clip actuating means 62 simultaneously depress the clips to disengage same from the wafer to enable the removal thereof by chuck 60, whereupon the door is opened and the wafer again positioned over the path of blade 83. Meanwhile, stepper motor means 80 and chain means 75 move the cassette back so that the original position of wafer 15 is presented over the blade path. Blade 83 then rises through conveyor rails 72 and 73 and slot 85 upwardly to engage the lower edge of wafer 15, whereupon chuck 60 releases the wafer, and enables blade 83 to lower the wafer back into its original position within the cassette. The cassette is then propelled forward to the position of the next wafer to be processed serially.

As aforementioned, pressure plate 16 is driven against carrier plate 18 and wall 32 whenever door 22 is in its opened position, to protect the evacuated interior environment of the chamber from the atmosphere. We have seen that FIGS. 4 and 5 show in more detail the relative positioning of the pressure plate and wafer carrier plate, with FIG. 4 showing the aforementioned sandwich arrangement of the elements defining the load lock arrangement 12, and FIG. 5 showing the relative positioning of the elements when the pressure plate is in its withdrawn position. Note also that FIG. 4 shows vacuum chuck 60 in its extended position as the wafer is inserted into clip assemblies 20 with pins 67 of clip actuating means 62 partially extended after having spread the clips; while in FIG. 5, the vacuum chuck has withdrawn, as have the pins of the clip actuating means, and the wafer is now securely mounted in wafer carrier plate assembly 18. With pressure plate 16 withdrawn, the wafer is now ready to be rotated to subsequent processing stations. In FIG. 6, the vacuum chuck is also in the withdrawn position; however, the vacuum suction is operative, and the wafer is shown in its position against the inner face 64 of chamber door 22. This is, of course, the position of the elements of the load lock and the wafer just after the wafer has been withdrawn from clip assemblies 20, prior to its being removed from the load lock; or, it also represents the position of the elements just after the door has been closed and the vacuum chuck has not yet advanced the wafer to its position within aperture 51 of the wafer carrier assembly. Pins 67 of the clip actuating means 62 are shown bearing upon the clips just prior to depressing same to spread the clips in order to accept the wafer therewithin.

Upon completion of loading of the load lock with a wafer 15, the load lock chamber is pumped down to a level compatible with the processing chamber environment before the pressure plate is withdrawn as shown in FIG. 5, and the wafer 15 rotated to the first work station.

While a wafer is being loaded into and/or unloaded from load lock station 12, pressure plate 16 is in its active advanced position of FIG. 4, whereby plate assembly 18 is forced against front wall 32 of the chamber, the pressure plate is similarly urging wafers in the remaining stations into contact or closer, working cooperation with the processing devices at those stations; for example, the first or heating station 28.

The next station (see FIGS. 1 and 9) to which the wafer is advanced is coating station 14, where a sputter coating source 100 is mounted on the back plate 99 of the chamber, and for which an aperture 101 of circular form is made within the pressure plate, to enable the sputtering source to direct coating therethrough to a wafer advanced by carrier plate assembly 18 into registration at the coating station. A shutter 102 is also provided to enable the coating material to be blocked during rotation of the carrier plate assembly and when a wafer is not present at the coating station.

Referring once again to FIG. 1, the next station to which the wafer 15 is advanced is a second coating station 128. After leaving station 128, the wafer proceeds to station 130 which may be a cooling station.

The final station to which wafer 15 is advanced is the load lock station 12, from which the wafer is removed and returned by means of load/unload assembly 24 to the same slot in the cassette 70 from which it originally came. The entire load/unload operation was described in detail earlier.

The preferred embodiment of the apparatus of this invention includes a plurality of processing stations for heating, coating, cooling and the like, and a wafer carrier plate assembly 18 for transporting wafers on an individual basis from station to station. For certain applications, an alternative embodiment includes an apparatus in which the wafer or other substrate remains affixed to the load lock door during processing, the wafer carrier plate assembly being eliminated. A gate valve or other type of sealing plate on the high vacuum side of the load lock is movable to provide sequentially both internal sealing of the load lock chamber and communication between the wafer and the processing source. Although the apparatus of this embodiment lacks some of the versatility and high production rate capability of the preferred embodiment, it does have several appealing features, including: inherent simplicity and reliability; no wafer transport inside the vacuum system; and the wafer load at risk is at the irreducible minimum of one.

In the embodiment of the apparatus of this invention, the wafer 15 is presented vertically to the inside face of chamber door 22, where it is engaged by vacuum chuck 60. Vacuum chuck 60 and clip actuating means 62 are mounted within the chamber door 22. Chamber door 22 is the outer door of load lock arrangement 12.

In some applications it may be desirable to separate the wafer loading/unloading means from the vacuum sealing means. Accordingly, a further embodiment is one in which the wafer loading/unloading means retracts after loading the wafer into wafer carrier plate assembly 18, following which a separate O-ring-sealed door is brought into position to effect the outer seal for the load lock.

Figure 8:
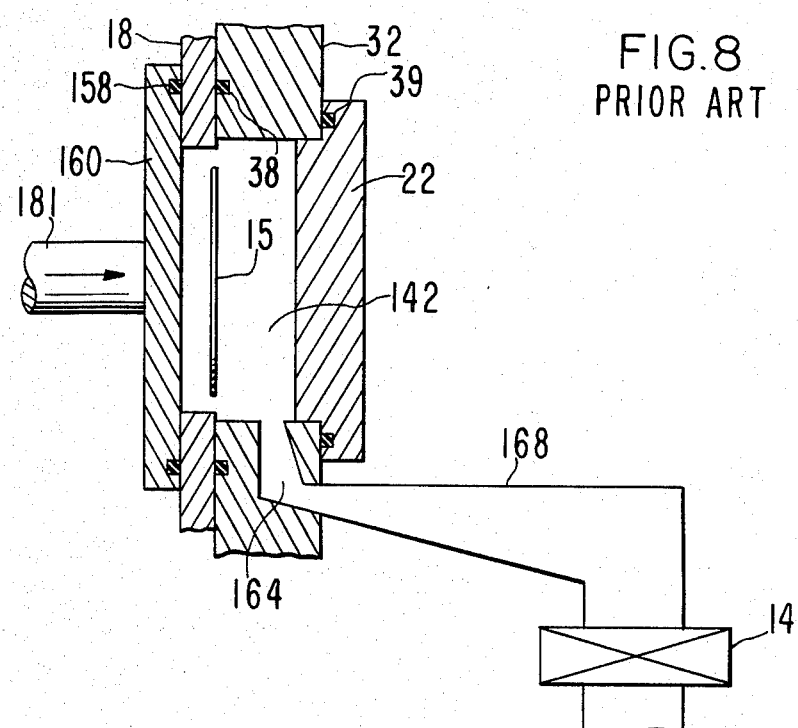
FIG. 8 is a cross-sectional elevational view of the load lock showing the connection to the vacuum pumping system in the prior art.

In the context of the wafer coating system described above, the load lock is an essential part. The efficiency of pumping of the load lock limits the cycle time and contributes significantly to the cost of building and operating the system. The pumping system as known in the prior art is shown in a simplified section of the load lock in FIG. 8. The front wall of the chamber 32 is sealed by the door 22 with O-ring seal 39. The wafer carrier plate assembly 18 is sealed to the front wall with O-ring 38. The wafer 15 is shown schematically in the carrier plate assembly 18. A sealing plate 160 with O-ring seal 158 is held in place by shaft 181 of a pneumatic ram. The sealing plate can be the full pressure plate 16 or can be a disk large enough only to seal around the periphery of the aperture in carrier plate 18, as shown in FIG. 8. Alternatively, as previously discussed, the wafer can be held by the sealing door during processing and carrier plate 18 can be omitted, in which case plate 160 would seal against the inside of chamber wall 18 around the periphery of the chamber entrance opening. For pumping the load lock, high vacuum pumping system is combined with a roughing pump and is connected to the load lock through the exhaust manifold 168 and load lock isolation valve 140.

The load lock interior is a shallow cylinder to accommodate the wafer and keep the volume small. In the prior art, the vacuum pumping system for evacuating the load lock was connected through the thin edge of the cylinder (wall 32) as shown in FIG. 8. The total volume of gas that goes to atmosphere each cycle is load lock volume 142 plus the volume of connecting manifold 168. The connecting manifold volume cannot be made smaller due to mechanical constraints of other functions involved in opening and closing the load lock door and of moving the wafer in and out of the system. The cost in pumping equipment to exhaust this total volume from atmosphere to a low pressure prior to moving the wafer into the operation chamber is related to five things: (1) the volume of atmospheric gas to be exhausted, (2) the surface area exposed to the atmosphere when the load lock is open, (3) the ultimate vacuum pressure needed, (4) the conductance in the tubing between the load lock and the pump, and (5) the time desired for reaching the necessary low pressure in the load lock.

The time desired for reaching the necessary low pressure in the load lock depends on the type of processing system. In the system particularly disclosed herein, a first workpiece is moved from the load lock to a remote processing station in the main vacuum chamber, held stationary and processed, and then moved to another processing station or directly back to the load lock. In such a system, a second workpiece is inserted into the load lock while the first workpiece is held stationary at a processing station. Thus, in order for maximum throughput, the load lock must be pumped in the time required for processing at each of the one or more processing stations, if the time is the same at each station, or the longest time if the times are different. It is an unnecessary expense to pump the load lock in a shorter time. If pumping takes longer than the stationary processing time, the fastest possible throughput is not achieved.

In another type of processing system, a workpiece is introduced into the load lock where it remains during processing and is then removed before introducing the next workpiece. Referring to FIG. 8, such a system may be one in which after pumping the load lock, the workpiece 15 remains stationary in the load lock, sealing disk 160 is moved far to the left, and the workpiece is processed in-situ, for example, by an ion implantation beam. In such a system, the desired time for reaching the necessary vacuum in the load lock is as short as possible in order to achieve highest throughput.

Regardless of the desired pumping time for the particular system, assuming it is reasonably short, the cost of pumping equipment can be minimized by reducing the volume exposed to the atmosphere, reducing the surface area exposed to the atmosphere and reducing the restrictions in the tubing between the load lock and the pump. To improve the pumping time without changing the geometry, it is necessary to increase the pump capacity and thereby the costs. In the case of very short desirable pumping time, it may not be possible for presently known pumps to do the job, practically regardless of cost. In FIG. 8 the constriction 164 inherent in the prior art significantly restricts the pumping rate at low pressures. Also, the substantial volume and surface area formed by manifold 168 up to valve 140 greatly increases the required pumping time.

Figure 9:
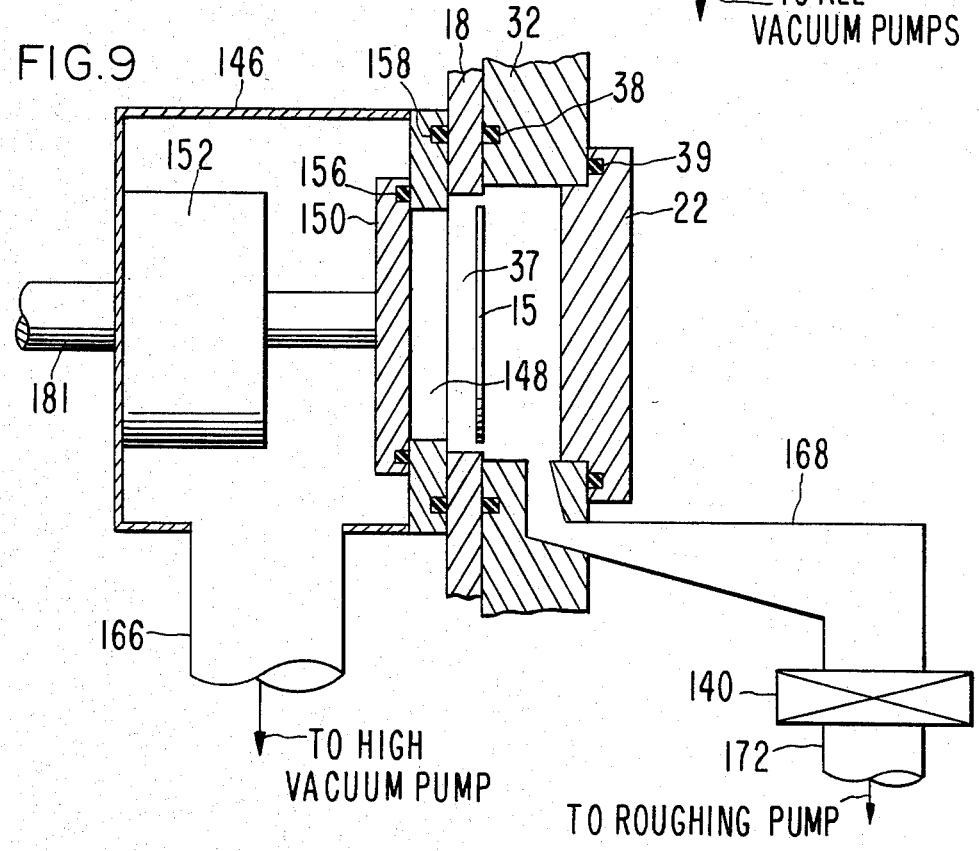
FIG. 9 is a cross-sectional elevational view of the load lock showing the connection to the vacuum pumping system in the preferred embodiment of the invention.

In the preferred embodiment of the invention shown in FIG. 9, the relationships of the front wall 32, door 22 with O-ring seal 39, wafer 15, wafer carrier plate assembly 18 with O-ring seal 38 remain as previously shown. The exhaust manifold 168, valve 140 remain as before but the connector 172 now leads to a roughing pump only. The sealing plate 160 in the prior art is replaced with a mini-chamber 146 which seals at the back of the wafer carrier plate assembly 18 with the O-ring sealing means 158. The mini-chamber 146 has an aperture 148 which approximately matches the aperture 37. The mini-chamber has an outlet 166 to the high vacuum pump and is positioned to seal against the wafer carrier plate assembly 18 by the pneumatic ram 181. Within the mini-chamber 146, there is a valve plate 150 with O-ring 156 which is positioned to seal by the valve actuator 152.

In operation, the wafer 15 is inserted into the load lock and then the door 22 is closed and sealed. The mini-chamber 146 was previously sealed against the wafer carrier plate using the pneumatic ram 181 and the valve plate 150 was sealed inside the mini-chamber 146 using the actuator 152. The valve 140 is opened to rough pump the load lock through the connector 172. When a suitable pressure is reached, valve 140 is closed and then the valve plate 150 is withdrawn using the actuator 152 permitting the high vacuum pumping system to pump the load lock through the connector 166. When the ultimate high vacuum for the load lock is reached the valve plate 150 is again sealed using the actuator 152 and the mini-chamber 146 is withdrawn from contact with the wafer carrier plate 18 using the pneumatic ram 181. The pressure plate which fits around the mini-chamber to seal the wafer carrier plate 18 is then withdrawn allowing the carrier plate to be rotated to the next station. The pressure plate is then repositioned, the mini-chamber 146 sealed against the wafer carrier plate 18, the load lock is exposed to the atmosphere, the door 22 unsealed and opened to begin a new cycle.

The large aperture 148 with large valve plate 150 permits molecules being pumped by the high vacuum pumping system to have a larger mean free path between collisions and therefore a higher pumping rate than in the prior art. It is estimated that the pumping time using the invention is one-tenth of that in the prior art.

Figure 10:
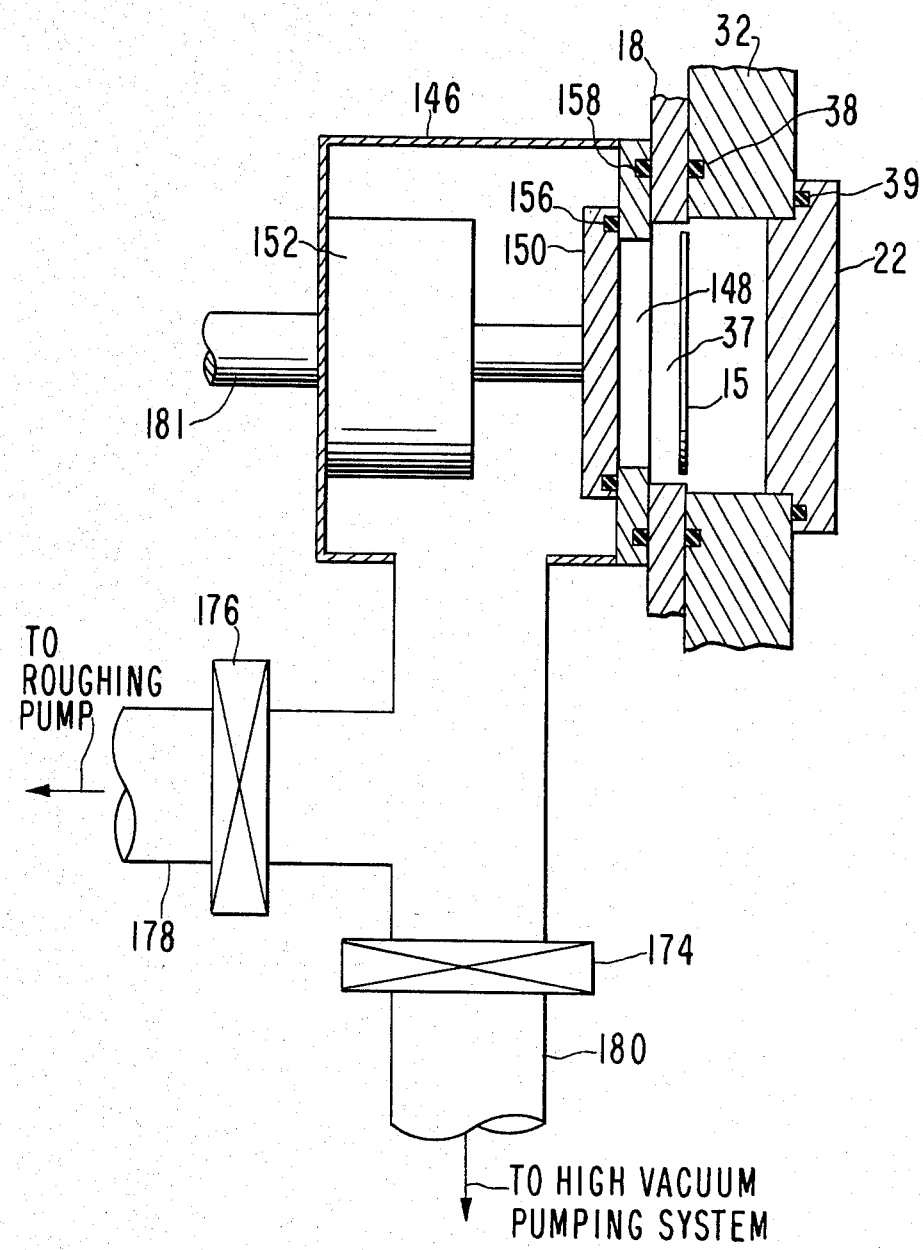
FIG. 10 is a cross-sectional elevational view of the load lock showing the connection to the vacuum pumping system in an alternate embodiment of the invention.

In an alternate embodiment shown in FIG. 10, the valve 174 is used to isolate the connector 180 to the high vacuum pumping system. After the valve plate 150 is unsealed the valve 176 is opened to allow rough pumping through the connector 178. At a suitable pressure, valve 176 is closed and valve 174 is opened to pump to a high vacuum. This embodiment has the disadvantage that the mini-chamber 146 is exposed to a higher pressure than in the preferred embodiment.

Figure 11:
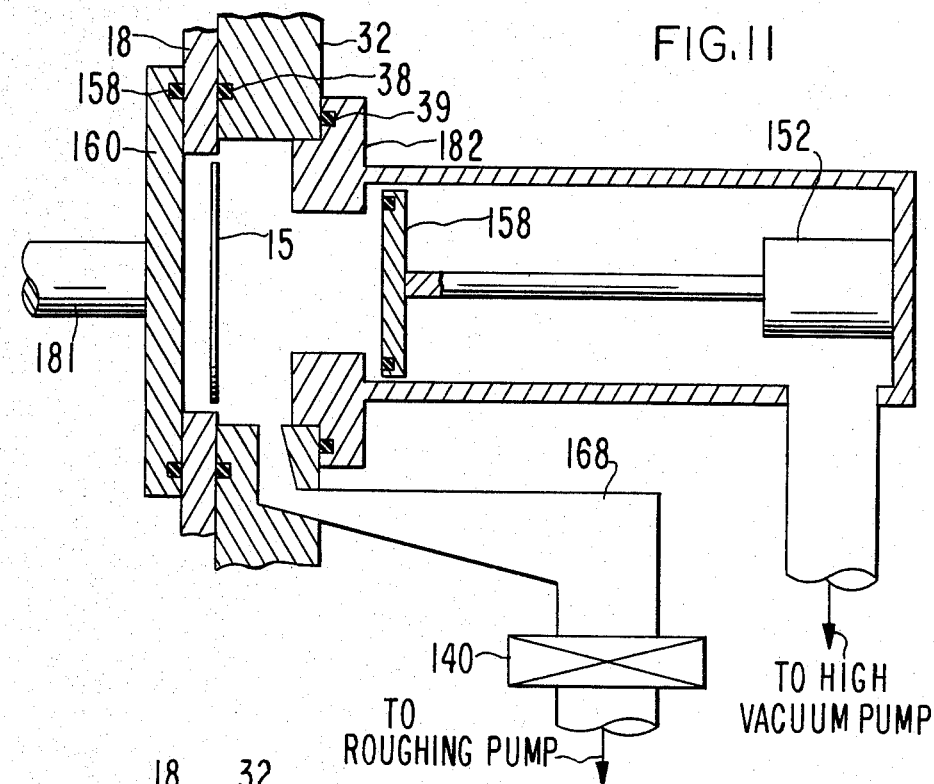
FIG. 11 is a cross-sectional elevational view of the load lock showing the connection to the vacuum pumping system in an alternate embodiment of the invention showing pumping through the door and separate rough pumping.

Another alternate embodiment is shown in FIG. 11. Here a solid pressure plate 160 with O-ring seal 158 is used to seal to the wafer carrier plate 18. The mini-chamber as shown in FIG. 9 is now combined with door 22 to form a mini-chamber-door unit. The separate roughing pump inlet 168 is used in this embodiment. This embodiment has the disadvantages that the connectors to the high vacuum pumping system are in the area in front of the door and hence are subjected to a large displacement with the opening of the door.

Figure 12:
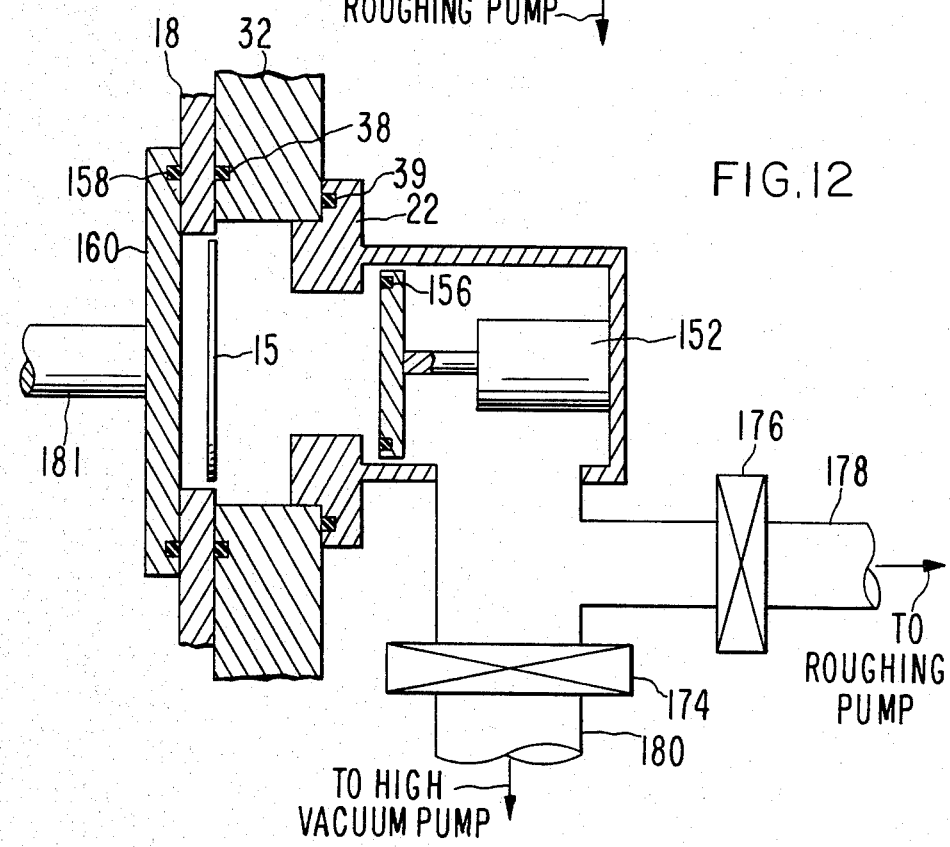
FIG. 12 is a cross-sectional elevational view of the load lock showing the connection to the vacuum pumping system in an alternate embodiment of the invention showing pumping through the door.

A further embodiment, the least desirable of those shown, can be seen in FIG. 12. Here the mini-chamber is again combined with the door as in the last previous embodiment. The roughing pump is connected inside the mini-chamber-door assembly. This embodiment has all the disadvantages of the embodiments shown in FIGS. 9 and 11.

This invention is not limited to the preferred embodiment and alternatives heretofore described, to which variations and improvements may be made, consisting of mechanically equivalent modifications to component parts, without leaving the scope of protection of the present patent, the characteristics of which are summarized in the following claims.

What is claimed is:

1. A pumping mechanism for a vacuum chamber comprising:
   a load lock having a front closure means through which a workpiece is inserted into said chamber and a rear closure means;
   said rear closure means having wall means forming a movable mini-chamber which forms a connection with an external pumping means, said mini-chamber including sealing means with said load lock and a ram whereby to close said rear closure means; and
   valve means including a sealing plate with sealing means inside said mini-chamber whereby to seal said load lock from said pumping means, said valve means including an actuator for moving said sealing plate.

2. A pumping mechanism according to claim 1 where said load lock includes a movable workpiece carrier plate with sealing means.

3. An improved load lock pumping mechanism for use in a system for coating thin substrates by deposition under vacuum on a wafer in a process chamber provided with an entrance opening, comprising:
   a circular door assembly with a first O-ring sealing means adapted and constructed to make a first vacuum-tight seal to an outer surface of a front wall of said chamber at said opening,
   a movable wafer carrier plate assembly adapted and constructed to hold said wafer within a first circular aperture in said plate assembly,
   a second O-ring sealing means on an inside surface of said front wall of said chamber at said opening adapted and constructed to form a second vacuum-tight seal between said front wall and said plate assembly,
   a mini-chamber movable within said process chamber having a second circular aperture roughly the same size as said first aperture in said plate assembly, and having an opening connected to an external high vacuum pump,
   a third O-ring sealing means on an outside surface of said mini-chamber around said second aperture adapted and constructed to form a third vacuum-tight seal between said plate assembly and said mini-chamber,
   a pneumatic ram whereby to push said mini-chamber against said plate assembly forming said second and third vacuum-tight seals,
   a valve plate within said mini-chamber having a fourth O-ring sealing means adapted and constructed to form a fourth vacuum-tight seal between said valve plate and an inside surface of said mini-chamber at said second aperture, and
   a valve actuator within said mini-chamber whereby to open and close said fourth vacuum-tight seal by moving said valve plate.

4. A mechanism as in claim 3 where said high vacuum pump is a turbomolecular pump.

5. Apparatus for processing workpieces in a vacuum type environment, said apparatus comprising:
   wall means forming a vacuum chamber having an entrance opening through which workpieces can be inserted into said vacuum chamber;
   processing means for processing workpieces inserted into said vacuum chamber;
   load lock means associated with said entrance opening and having a first movable closure means for sealing the outside of said entrance opening and a movable mini-chamber for sealing the inside of said entrance opening, whereby to provide in cooperation with said entrance opening a load lock chamber shaped to contain a workpiece, said movable mini-chamber having a pumping aperture therein; and
   said movable mini-chamber forming a connection to external pumping means, said mini-chamber movable by a ram and including therein
   valve means operable to open and close an opening in said mini-chamber.

6. Vacuum chamber load lock apparatus comprising:
   a vacuum chamber a having wall with an opening therein for insertion of a workpiece;
   load lock means for sealing said opening from the inside of said vacuum chamber and from the outside of said vacuum chamber so as to form a load lock chamber;
   said load lock means including a mini-chamber having wall means forming an aperture adjacent one side of said vacuum chamber opening, a sealing rim around said aperture, and means for moving said mini-chamber and its sealing rim toward and away from said opening;
   valve means associated with said mini-chamber aperture, and means for moving said valve means to close and open said aperture, said mini-chamber and said valve means being movable to a closing position in which said valve means forms one side of said load lock chamber;
   said load lock means further including closure means for forming the other side of said load lock chamber; and
   conduit means for connecting said mini-chamber to vacuum pump means.

7. The apparatus of claim 6 wherein said mini-chamber is outside said vacuum chamber.

8. The apparatus of claim 6 wherein said mini-chamber is inside said vacuum chamber.

9. The apparatus of claim 8 further comprising a wafer carrier plate assembly inside said vacuum chamber, said carrier plate assembly being adapted and constructed to hold a workpiece within an aperture therein, said carrier plate assembly being movable toward said vacuum chamber opening to form a sealing contact with the inner surface of said vacuum chamber wall around said vacuum chamber opening, the construction and arrangement of said carrier plate assembly and said mini-chamber being such that when said mini-chamber is moved to said closing position, said carrier plate assembly is sealed against the inside of said vacuum chamber wall, and said mini-chamber sealing rim is sealed against said carrier plate assembly, and said vacuum chamber opening, said carrier plate aperture and said mini-chamber aperture are aligned with each other.

10. The apparatus of claim 8 wherein said means for moving said mini-chamber moves the mini-chamber along a straight line path coaxial with the axis of said vacuum chamber opening.

11. The apparatus of claim 8 wherein said pumping means for said mini-chamber comprises a roughing pump means and a high vacuum pump means, and said conduit means comprises a conduit to said roughing pump means and a separate conduit to said high vacuum pump means, and a valve in each of said conduits.

12. The apparatus of claim 8 further comprising a passageway in said vacuum chamber wall and adapted to connect said vacuum chamber opening to vacuum pump means.

13. The apparatus of claim 12 wherein said pump means for said vacuum chamber opening is a roughing pump means, and said pump means for said mini-chamber is a high vacuum pump means.

14. Apparatus for processing workpieces in a vacuum type environment, said apparatus comprising:
   wall means forming a vacuum chamber having an entrance opening through which workpieces can be inserted into said vacuum chamber;
   processing means in said vacuum chamber for processing workpieces inserted into said vacuum chamber;
   load lock means associated with said entrance opening and having a first movable closure means for sealing the outside of said entrance opening and a second movable closure means for sealing the inside of said entrance opening, whereby to provide in cooperation with said entrance opening a load lock chamber shaped to contain a workpiece;
   one of said closure means comprising wall means movable as a unit relative to said vacuum chamber opening and forming a mini-chamber;
   said mini-chamber wall means having a first aperture for connection to a vacuum pumping means, and having a second aperture for communication with said entrance opening; and
   valve means movable with respect to said mini-chamber wall means for opening and closing said second aperture.

* * * * *